(12) United States Patent
Chung et al.

(10) Patent No.: US 10,651,417 B2
(45) Date of Patent: May 12, 2020

(54) DISPLAY SUBSTRATE

(71) Applicant: Samsung Display Co., Ltd., Yongin-si (KR)

(72) Inventors: Jinkoo Chung, Suwon-si (KR); Seong-Min Kim, Yongin-si (KR); Hye Hyang Park, Yongin-si (KR); Jinhyun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/515,329

(22) Filed: Jul. 18, 2019

(65) Prior Publication Data

US 2019/0341575 A1 Nov. 7, 2019

Related U.S. Application Data

(62) Division of application No. 15/951,588, filed on Apr. 12, 2018, now Pat. No. 10,403,847.

(30) Foreign Application Priority Data

Apr. 14, 2017 (KR) .................. 10-2017-0048684

(51) Int. Cl.
*H01L 51/52* (2006.01)
*H01L 27/32* (2006.01)
(Continued)

(52) U.S. Cl.
CPC ........ *H01L 51/5234* (2013.01); *H01L 27/326* (2013.01); *H01L 51/5056* (2013.01);
(Continued)

(58) Field of Classification Search
CPC . H01L 51/5234; H01L 51/5072; H01L 51/56; H01L 27/326; H01L 51/5262;
(Continued)

(56) References Cited

U.S. PATENT DOCUMENTS

2002/0021266 A1 2/2002 Koyama et al.
2005/0275339 A1* 12/2005 Seo et al. ............ H01L 27/3244
313/503

(Continued)

FOREIGN PATENT DOCUMENTS

| KR | 10-2011-0097381 | 8/2011 |
| KR | 10-1084195 | 8/2011 |
| KR | 10-2016-0039080 | 4/2016 |

OTHER PUBLICATIONS

Notice of Allowance dated Apr. 18, 2019, in U.S. Appl. No. 15/951,588.

*Primary Examiner* — Thinh T Nguyen
(74) *Attorney, Agent, or Firm* — H.C. Park & Associates, PLC

(57) ABSTRACT

A display substrate including a base substrate including a plurality of pixel areas, each of the plurality of pixel areas including an emission area and a transmission area, a pixel circuit layer disposed in the emission area and including at least one transistor, a pixel electrode disposed on the pixel circuit layer and connected to the pixel circuit layer, a hole injection layer selectively disposed on the pixel electrode in the emission area, an emission layer disposed on the hole injection layer of the emission area, an electron injection layer disposed on the base substrate on which the emission layer is disposed; and a common electrode disposed on the base substrate on which the electron injection layer is disposed.

7 Claims, 12 Drawing Sheets

(51) Int. Cl.
*H01L 51/56* (2006.01)
*H01L 51/50* (2006.01)

(52) U.S. Cl.
CPC ...... *H01L 51/5072* (2013.01); *H01L 51/5088* (2013.01); *H01L 51/5262* (2013.01); *H01L 51/56* (2013.01); *H01L 27/3258* (2013.01); *H01L 2251/5307* (2013.01)

(58) Field of Classification Search
CPC ............ H01L 51/5088; H01L 51/6056; H01L 27/3258; H01L 2251/5307
USPC ............ 257/40, 59, 72; 438/48, 82, 99, 128
See application file for complete search history.

(56) References Cited

U.S. PATENT DOCUMENTS

| | | |
|---|---|---|
| 2011/0204369 A1 | 8/2011 | Ha et al. |
| 2011/0207254 A1 | 8/2011 | Lee |
| 2013/0187131 A1 | 7/2013 | Chung et al. |
| 2016/0093679 A1 | 3/2016 | Moon et al. |

\* cited by examiner

DISPLAY SUBSTRATE

CROSS REFERENCE TO RELATED APPLICATION

This application is a Division of U.S. patent application Ser. No. 15/951,588, filed Apr. 12, 2018, and claims priority from and the benefit of Korean Patent Application No. 10-2017-0048684 filed on Apr. 14, 2017, each of which is hereby incorporated by reference for all purposes as if fully set forth herein.

BACKGROUND

Field

Exemplary embodiments of the present invention relate to a display substrate. More particularly, exemplary embodiments of the inventive concept relate to a display substrate for improving a display quality.

Discussion of the Background

A flat panel display (FPD) device is widely used as a display device of an electronic device for its lightweight and thinness compared to a cathode-ray tube (CRT) display device. Typical examples of the FPD device are a liquid crystal display (LCD) device and an organic light emitting display device.

Compared to the LCD device, the organic light emitting display device has several advantages, such as a higher luminance and a wider viewing angle. In addition, the organic light emitting display device can be made thinner because the organic light emitting display device does not require a backlight. In the organic light emitting display device, electrons and holes are injected into an organic thin layer through a cathode and an anode, and recombined in the organic thin layer to generate excitons, thereby emitting a light of a certain wavelength.

Recently, a transparent display device that is capable of transmitting an image of an object (or target) that is displayed in a rear (or at the back) of the display device by including a transparent region and a pixel region has been developed.

The above information disclosed in this Background section is only for enhancement of understanding of the background of the inventive concepts. Therefore, it may contain information that does not form the prior art that was already known to a person of ordinary skill in the art or was publically available prior to an effective filing date of subject matter disclosed herein.

SUMMARY

Exemplary embodiments of the present invention provide a display substrate having increased transmittance.

Additional features of the invention will be set forth in the description which follows, and in part will be apparent from the description, or may be learned by practice of the invention.

An exemplary embodiment of the present invention discloses a display substrate including a base substrate including a plurality of pixel areas, each of the plurality of pixel areas including an emission area and a transmission area, a pixel circuit layer disposed in the emission area and including at least one transistor, a pixel electrode disposed on the pixel circuit layer and connected to the pixel circuit layer, a hole injection layer selectively disposed on the pixel electrode in the emission area, an emission layer disposed on the hole injection layer of the emission area, an electron injection layer disposed on the base substrate on which the emission layer is disposed; and a common electrode disposed on the base substrate on which the electron injection layer is disposed.

In an exemplary embodiment, the display substrate may further include a buffer layer disposed between the base substrate and the pixel circuit layer in the emission area, a hole transport layer disposed between the hole injection layer and the emission layer in the emission area, and an electron transport layer disposed between the electron injection layer and the emission layer in the emission area.

In an exemplary embodiment, the electron transport layer may be disposed under the electron injection layer in the transmission area.

In an exemplary embodiment, the buffer layer may be disposed between the base substrate and the hole injection layer in the transmission area.

In an exemplary embodiment, the hole transport layer may be disposed between the electron transport layer and the hole injection layer in the transmission area.

In an exemplary embodiment, the display substrate may further include an encapsulation layer disposed on the common electrode in the emission area and the transmission area.

An exemplary embodiment of the present invention also discloses a display substrate including a base substrate including a plurality of pixel areas, each of the plurality of pixel areas including an emission area and a transmission area, a pixel circuit layer disposed in the emission area and including at least one transistor, a pixel electrode disposed on the pixel circuit layer and connected to the pixel circuit layer, a first hole injection layer disposed on the pixel electrode in the emission area and having a first thickness, a second hole injection layer disposed in the transmission area and having a second thickness different from the first thickness, an emission layer disposed on the first hole injection layer of the emission area, an electron injection layer disposed on the emission layer in the emission area and the second hole injection layer in the transmission area, and a common electrode disposed on the base substrate on which the electron injection layer is disposed.

In an exemplary embodiment, the display substrate may further include a buffer layer disposed between the base substrate and the pixel circuit layer in the emission area, a hole transport layer disposed between the first hole injection layer and the emission layer in the emission area and an electron transport layer disposed between the electron injection layer and the emission layer in the emission area.

In an exemplary embodiment, the electron transport layer may be disposed under the electron injection layer in the transmission area.

In an exemplary embodiment, the buffer layer may be disposed between the base substrate and the hole injection layer in the transmission area.

In an exemplary embodiment, the hole transport layer may be disposed between the electron transport layer and the buffer layer in the transmission area.

In an exemplary embodiment, the second hole injection layer of the second thickness in the transmission area may have a transmittance higher than the first injection layer of the first thickness in the emission area.

In an exemplary embodiment, the display substrate may further include an encapsulation layer disposed on the common electrode in the emission area and the transmission area.

An exemplary embodiment of the present invention also discloses a display substrate including a base substrate including a plurality of pixel areas, each of the plurality of pixel areas including an emission area and a transmission area, a pixel circuit layer disposed in the emission area and including at least one transistor, a pixel electrode disposed on the pixel circuit layer and connected to the pixel circuit layer, a hole injection layer disposed on a pixel electrode in the emission area and the base substrate in the transmission area, the hole injection layer having a refractive index between refractive indexes of upper and lower layers of the hole injection layer in the transmission area, an emission layer disposed on the hole injection layer in the emission area, an electron injection layer disposed on the base substrate on which the emission layer is disposed, and a common electrode disposed on the base substrate on which the electron injection layer is disposed.

In an exemplary embodiment, the refractive indexes of the lower layer, the hole injection layer and the upper layer gradually increase in the transmission area.

In an exemplary embodiment, the display substrate may further include a buffer layer disposed between the base substrate and the pixel circuit layer in the emission area, a hole transport layer disposed between the hole injection layer and the emission layer in the emission area, and an electron transport layer disposed between the electron injection layer and the emission layer in the emission area.

In an exemplary embodiment, the lower layer is the buffer layer and the upper layer is the electron transport layer in the transmission area.

In an exemplary embodiment, the lower layer is the buffer layer and the upper layer is the hole transport layer in the transmission area.

In an exemplary embodiment, the pixel circuit layer includes a plurality of metal patterns and a plurality of insulation layers between the plurality of metal patterns, and the lower layer is at least one of the plurality of insulation layers in the transmission area.

In an exemplary embodiment, the display substrate may further include an encapsulation layer disposed on the common electrode in the emission area and the transmission area.

According to the inventive concept, the hole injection layer may be disposed only in the emission area EA. In addition, the hole injection layer, the upper layer adjacent to the hole injection layer, and the lower layer adjacent to the hole injection layer may have their respective refractive indexes without the reversal of the refractive index with respect to the stacked structure in the transmission area TA. In addition, the hole injection layer may have a thickness corresponding to the highest transmittance in the transmission area. Therefore, the transmittance of the transmission area may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
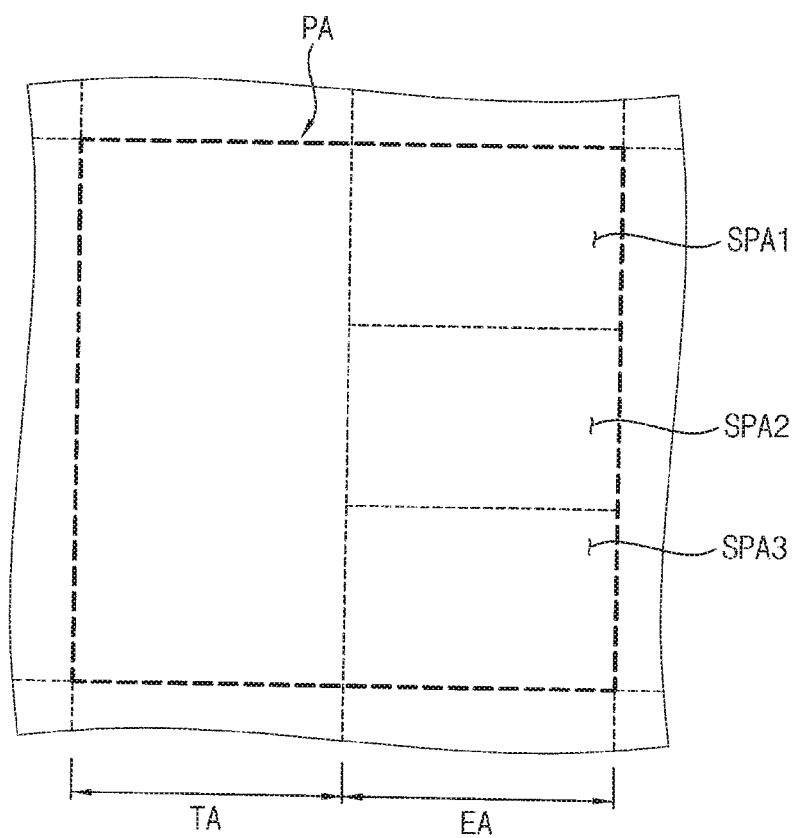
FIG. 1 is a plan view illustrating a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein Hereinafter, the inventive concept will be explained in detail with reference to the accompanying drawings.

Figure 2:
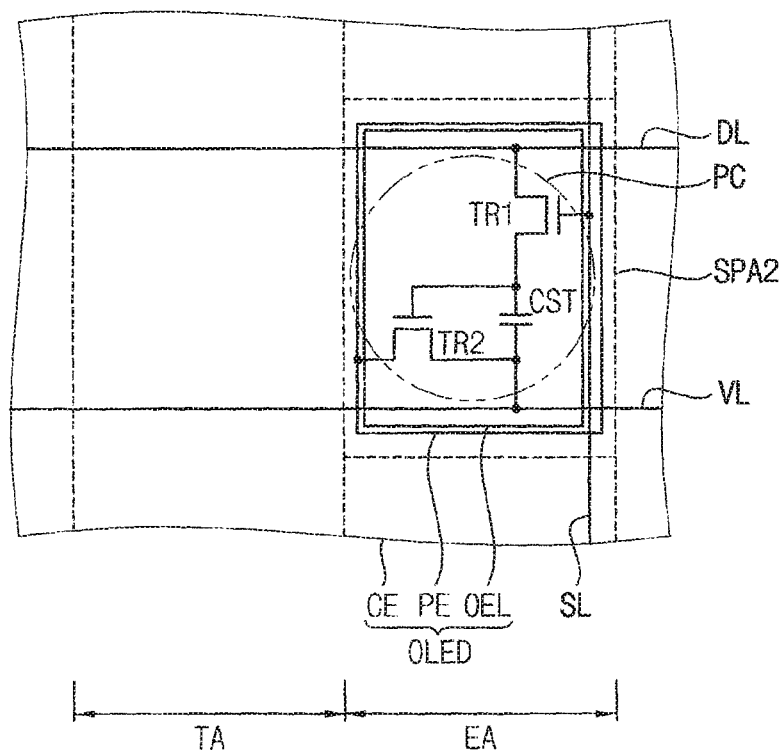
FIG. 2 is a conceptual diagram illustrating a subpixel area according to an exemplary embodiment.

FIG. 1 is a plan view illustrating a display apparatus according to an exemplary embodiment. FIG. 2 is a conceptual diagram illustrating a subpixel area according to an exemplary embodiment.

Referring to FIGS. 1 and 2, a display apparatus may include a plurality of pixel areas PA. Each of the plurality of pixel areas PA may include a transmission area TA and an emission area EA. The emission area EA may include a plurality of subpixel areas SPA1, SPA2, and SPA3.

The transmission area TA may be defined by a transmission window in which at least one of a plurality of insulating layers is etched and may transmit an external light.

As shown in FIG. 1, the transmission area TA may be defined corresponding to first, second, and third subpixel areas SPA1, SPA2 and SPA3. Although not shown in the figures, the transmission area TA may include a plurality of sub-transmission areas, which may be defined respectively corresponding to the first, second, and third subpixel areas SPA1, SPA2, and SPA3.

The transmission area TA may be planar having a substantially square shape (or a substantially rectangular shape), but the present disclosure is not limited thereto. For example, the transmission area TA may be planar having a substantially triangular shape, a substantially diamond shape, a substantially polygonal shape, a substantially circular shape, a substantially race-track shape, or a substantially elliptical shape.

The emission area EA may include first, second, and third subpixel areas SPA1, SPA2, and SPA3. The first, second, and third subpixels may be disposed in the first, second, and third subpixel areas SPA1, SPA2, and SPA3, respectively. The first subpixel may emit a red color, the second subpixel may emit a green color, and the third subpixel may emit a blue color.

As shown in FIG. 2, for example, a pixel circuit PC and an organic light emitting diode OLED connected to the pixel circuit PC are disposed in a second subpixel area SPA2. The pixel circuit PC may include a scan line SL, a data line DL, a voltage line VL, a first transistor TR1, a second transistor TR2, and a storage capacitor CST. The organic light emitting diode OLED may include a pixel electrode PE connected to the pixel circuit PC, an organic emission layer OEL, and a common electrode CE.

Figure 3A:
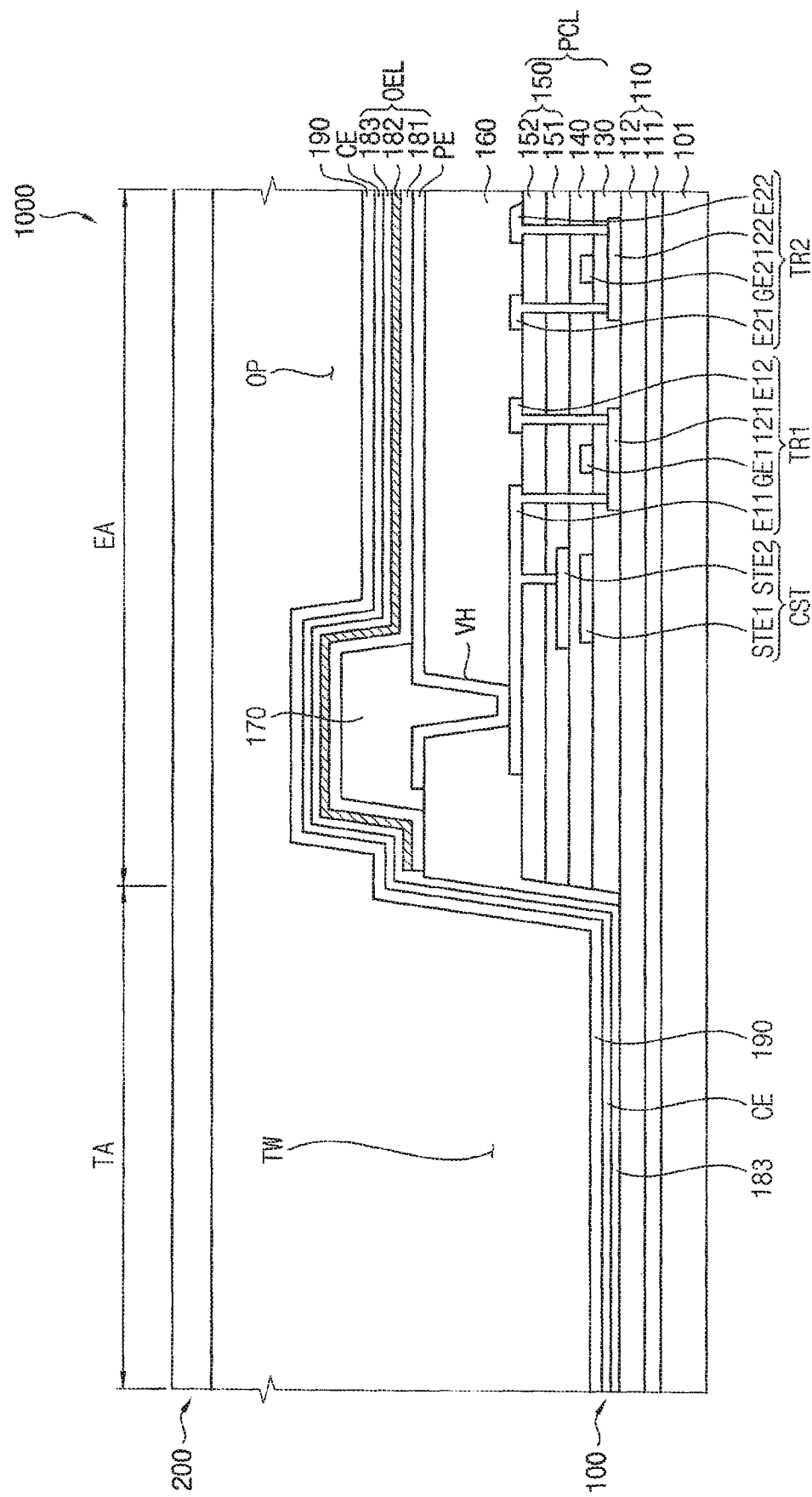
FIG. 3A is a cross-sectional view illustrating a display apparatus according to an exemplary embodiment.

FIG. 3A is a cross-sectional view illustrating a display apparatus according to an exemplary embodiment.

Referring to FIG. 3A, the display apparatus 1000 may include a display substrate 100 and an opposing substrate 200.

The display apparatus 1000 may include an emission area EA, in which the organic light emitting diode is disposed, and a transmission area TA in which an external light is transmitted.

The display substrate 100 may include a base substrate 101, a buffer layer 110, a pixel circuit layer PCL, a planarization layer 160, a pixel electrode PE, a pixel definition layer 170, an organic emission layer OEL, a common electrode CE, and an encapsulation layer 190.

The base substrate 101 may be formed of a transparent material. For example, the base substrate 101 may include a quartz substrate, a synthetic quartz substrate, a calcium fluoride substrate, a fluoride-doping quartz substrate, a sodalime substrate, a non-alkali substrate, etc. Alternatively, the base substrate 101 may be formed of a flexible transparent material, such as a flexible transparent resin. For example, the flexible transparent resin substrate may include a first polyimide layer, a barrier film layer, a second polyimide layer, etc.

The buffer layer 110 may be disposed on the base substrate 101. The buffer layer 110 may prevent diffusion of metal atoms and/or impurities into the base substrate 101. Additionally, the buffer layer 110 may improve a surface flatness of the base substrate 101. According to a type of the base substrate 101, at least two buffer layers may be provided on the base substrate 101. For example, the buffer layer 110 may include a first layer 111 formed of silicon nitride ($SiN_x$) and a second layer 112 formed of silicon oxide ($SiO_x$).

The pixel circuit layer PCL may be disposed in the emission area EA on the base substrate 101.

The pixel circuit layer PCL may include a first transistor TR1, a second transistor TR2, and a storage capacitor CST. The first transistor TR1 may include a first active pattern 121, a first gate electrode GE1, a first electrode E11, and a second electrode E12. The second transistor TR2 may include a second active pattern 122, a second gate electrode GE2, a first electrode E21 and a second electrode E22. The storage capacitor CST may include a first storage electrode STE1 and a second storage electrode STE2.

As shown in FIG. 3A, the first and second active patterns 121 and 122 may be disposed on the buffer layer 110 in the emission area EA. For example, the first and second active patterns 121 and 122 may be formed of an oxide semiconductor, an inorganic semiconductor (e.g., amorphous silicon, polysilicon, etc.), an organic semiconductor, etc.

A gate insulating layer 130 may be disposed in the emission area EA on the buffer layer 110 on which the first and second active patterns 121 and 122 are disposed. The gate insulating layer 130 may be formed of silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminium oxide ($AlO_x$), aluminium nitride ($AlN_x$), tantalum oxide ($TaO_x$), hafnium oxide ($HfO_x$), zirconium oxide ($ZrO_x$), titanium oxide ($TiO_x$), etc.

The first storage electrode STE1, the first gate electrode GE1, and the second gate electrode GE2 may be formed using a first gate metal layer and are disposed on the gate insulating layer 130 in the emission area EA. The first gate metal layer may be formed of metal, alloy, metal nitride, conductive metal oxide, transparent conductive material, etc., which may be used alone or in any suitable combination.

A first insulating interlayer 140 may be disposed in the emission area EA of the base substrate 101 on which the first storage electrode STE1, the first gate electrode GE1, and the second gate electrode GE2 are disposed. The first insulating interlayer 140 may be formed of silicon oxide, silicon nitride, silicon oxynitride, etc., which may be used alone or in any suitable combination.

A second storage electrode STE2 may be formed using a second gate metal layer and be disposed on the first insulating interlayer 140 in the emission area EA.

For example, the second gate metal layer may be formed of aurum (Au), argentum (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Jr), aluminium alloy, aluminium nitride ($AlN_x$), argentum alloy, tungsten W, tungsten nitride ($WN_x$), copper alloy, molybdenum alloy, titanium nitride ($TiN_x$), tantalum nitride ($TaN_x$), strontium ruthenium oxide ($SrRu_xO_y$), zinc oxide ($ZnO_x$), indume tin oxide (ITO), stannum oxide ($SnO_x$), indume oxide ($InO_x$), gallium oxide ($GaO_x$), indume zinc oxide (IZO), etc., which may be used alone or in any suitable combination.

A second insulating interlayer 150 may be disposed in the emission area EA on the base substrate 101 on which the second storage electrode STE2 is disposed. The second insulating interlayer 150 may be formed of silicon oxide, silicon nitride, silicon oxynitride, etc., which may be used alone or in any suitable combination. For example, the second insulating interlayer 150 may include a first layer 151 formed of silicon oxide ($SiO_x$) and a second layer 152 formed of silicon nitride ($SiN_x$).

First and second electrodes E11 and E12 of the first transistor TR1 and first and second electrodes E21 and E22 of the second transistor TR2 may be formed using a source metal layer, and be disposed on the second insulating interlayer 150 in the emission area EA. The source metal layer may be formed of metal, alloy, metal nitride, conductive metal oxide, transparent conductive material, etc., which may be used alone or in any suitable combination.

The planarization layer 160 may be disposed in the emission area EA on the base substrate 101 on which the first and second electrodes E11, E12, E21, and E22 are disposed. A via hole VH that exposes the first electrode E11 of the first transistor TR1 may be formed in the planarization layer 160.

A pixel electrode PE of the organic light emitting diode OLED may be connected to the first transistor TR1 through the via hole VH and may be disposed on the planarization layer 160 in the emission area EA.

The pixel electrode PE may be formed of metal, alloy, metal nitride, conductive metal oxide, transparent conductive material, etc., which may be used alone or in any suitable combination.

The pixel defining layer 170 may be disposed in the emission area EA on the base substrate 101 on which the pixel electrode PE is disposed. An opening OP may be formed in the pixel defining layer 180 exposing a portion of the pixel electrode PE.

The organic emission layer OEL may include a hole layer 181, a color emission layer 182, and an electron layer 183, which may be used in a single-layer structure or a multilayer structure. The organic emission layer OEL may be formed of any of various materials such as copper phthalocyanine (CuPc), N,N'-Di(naphthalene-1-yl)-N, N'-diphenylbenzidine (NPB), or tris-8-hydroxyquinoline aluminum (Alq3), etc.

The organic emission layer OEL may be formed by vacuum deposition. The hole layer 181 may include a hole injection layer HIL adjacent to the pixel electrode PE and a hole transport layer HTL adjacent to the color emission layer 182, as shown in FIG. 3B.

The color emission layer 182 may include light-emitting materials which emit a color light. For example, a first subpixel area may include a red light emitting layer which emits a red light, a second sub area may include a green light emitting layer which emits a green light and a third sub area may include a blue light emitting layer which emits a blue light.

Figure 3B:
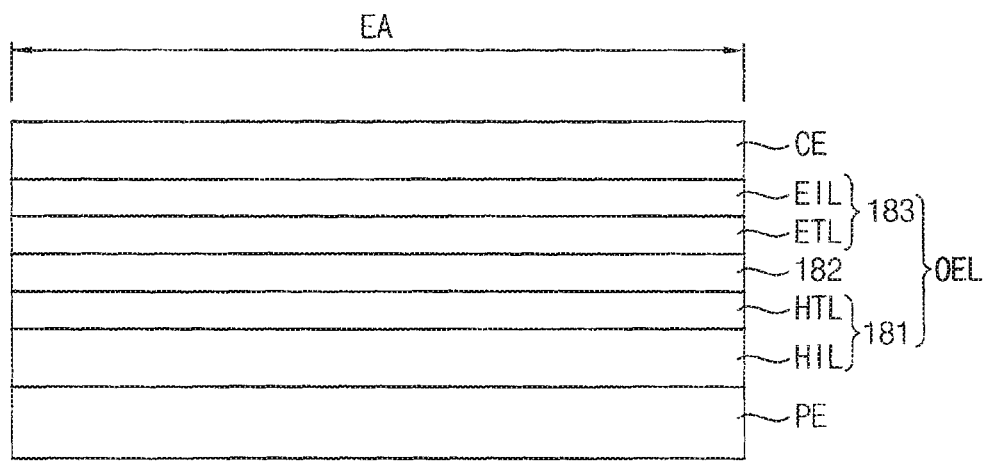
FIG. 3B is a cross-sectional close-up view of hole layer 181, color emission layer 182, and electron layer 183 shown in FIG. 3A.

The electron layer 183 may include an electron injection layer EIL adjacent to the common electrode CE and an electron transport layer ETL adjacent to the color emission layer 182, as shown in FIG. 3B.

The hole layer 181, the color emission layer 182, and the electron layer 183 may substantially stacked in the emission area EA. For example, the hole layer 181, the color emission layer 182, and the electron layer 183 may be substantially stacked in the opening OP which exposes the pixel electrode PE.

At least one of the hole layer 181 and the electron layer 183 in the organic emission layer OEL may be disposed in the transmission area TA.

According to the exemplary embodiment shown in FIG. 3A, only the electron layer 183 among the hole layer 181, the color emission layer 182, and the electron layer 183 may be disposed in the transmission area TA.

The hole injection layer HIL may have the greatest thickness and the hole injection layer HIL may have the highest refractive index among the hole injection layer HIL, the hole transport layer HTL, the electron transport layer ETL, and the electron injection layer EIL. Thus, a transmittance may decrease in an interface of the hole injection layer HIL having a high refractive index.

In order to prevent the transmittance from decreasing, according to the exemplary embodiment, the hole injection layer HIL in the hole layer 181 is disposed in only the emission area EA and is not disposed in the transmission area TA. Therefore, the display apparatus may prevent the transmittance from decreasing by the absence of the hole injection layer HIL having the high refractive index in the transmission area TA.

The common electrode CE may be disposed in both the emission area EA and the transmission area TA on the base substrate 101 on which the organic emission layer OEL is disposed. Thus, the organic light emitting diode OLED may be defined by the pixel electrode PE, the organic emission layer OEL, and the common electrode CE, which are disposed in the emission area EA.

The encapsulation layer 190 may be disposed on the emission area EA and the transmission area TA on the base substrate 101 on which the common electrode CE is disposed. The encapsulation layer 190 may protect the organic light emitting diode OLED. The encapsulation layer 190 may include a plurality of inorganic layers or a suitable combination thereof.

The opposing substrate 200 opposite to the display substrate 100 may be combined with the display substrate 100. The opposing substrate 200 may be formed of a transparent material. For example, the opposing substrate 200 may include a quartz substrate, a synthetic quartz substrate, a calcium fluoride substrate, a fluoride-doping quartz substrate, a sodalime substrate, a non-alkali substrate, etc. Alternatively, the opposing substrate 200 may be formed of a flexible transparent material, such as a flexible transparent resin. For example, the flexible transparent resin substrate may include a first polyimide layer, a barrier film layer, a second polyimide layer, etc.

Figure 4:
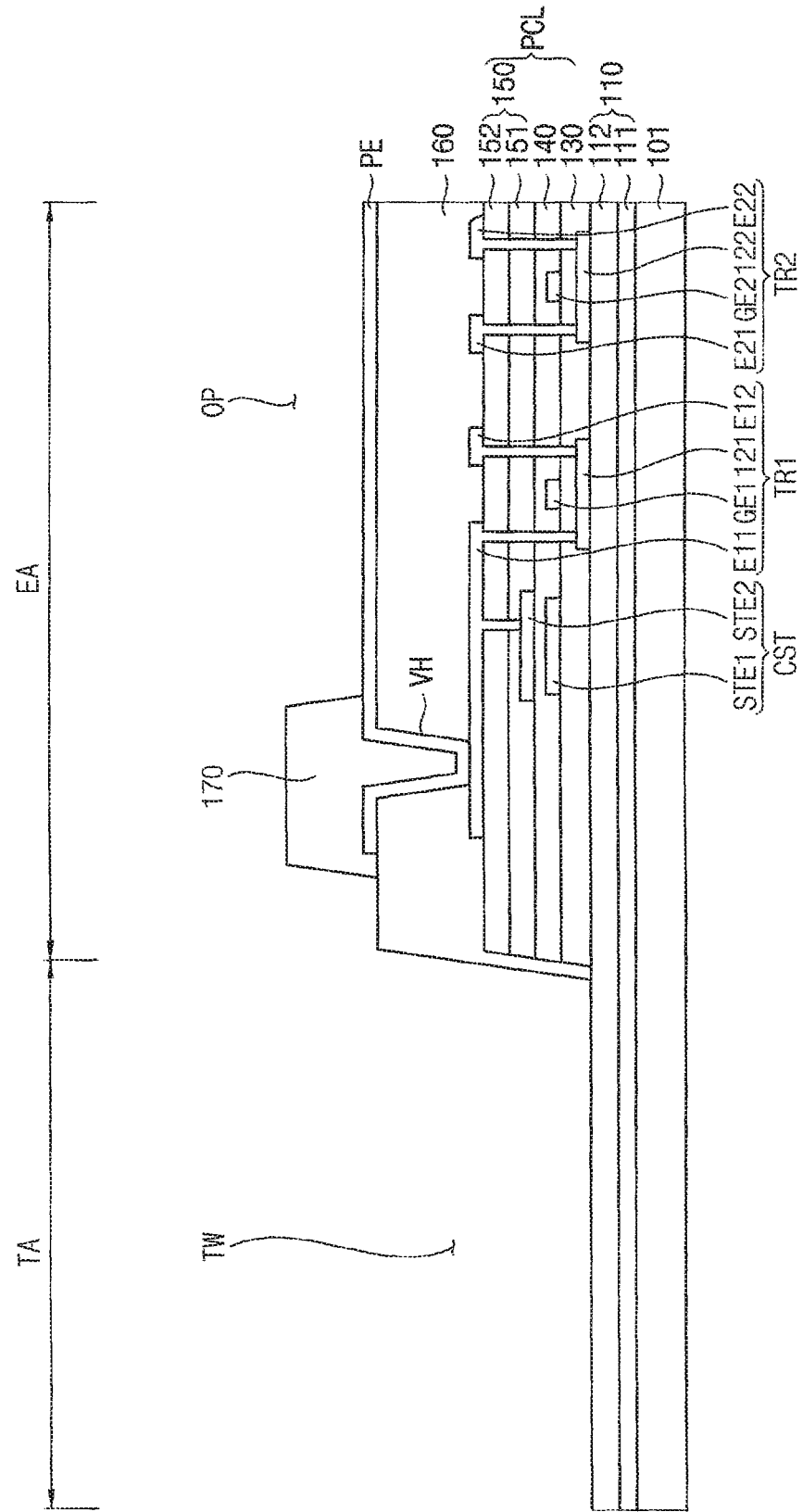
FIG. 4, FIG. 5, and FIG. 6 are cross-sectional views illustrating one method of manufacturing a display apparatus according to an exemplary embodiment.
Figure 5:
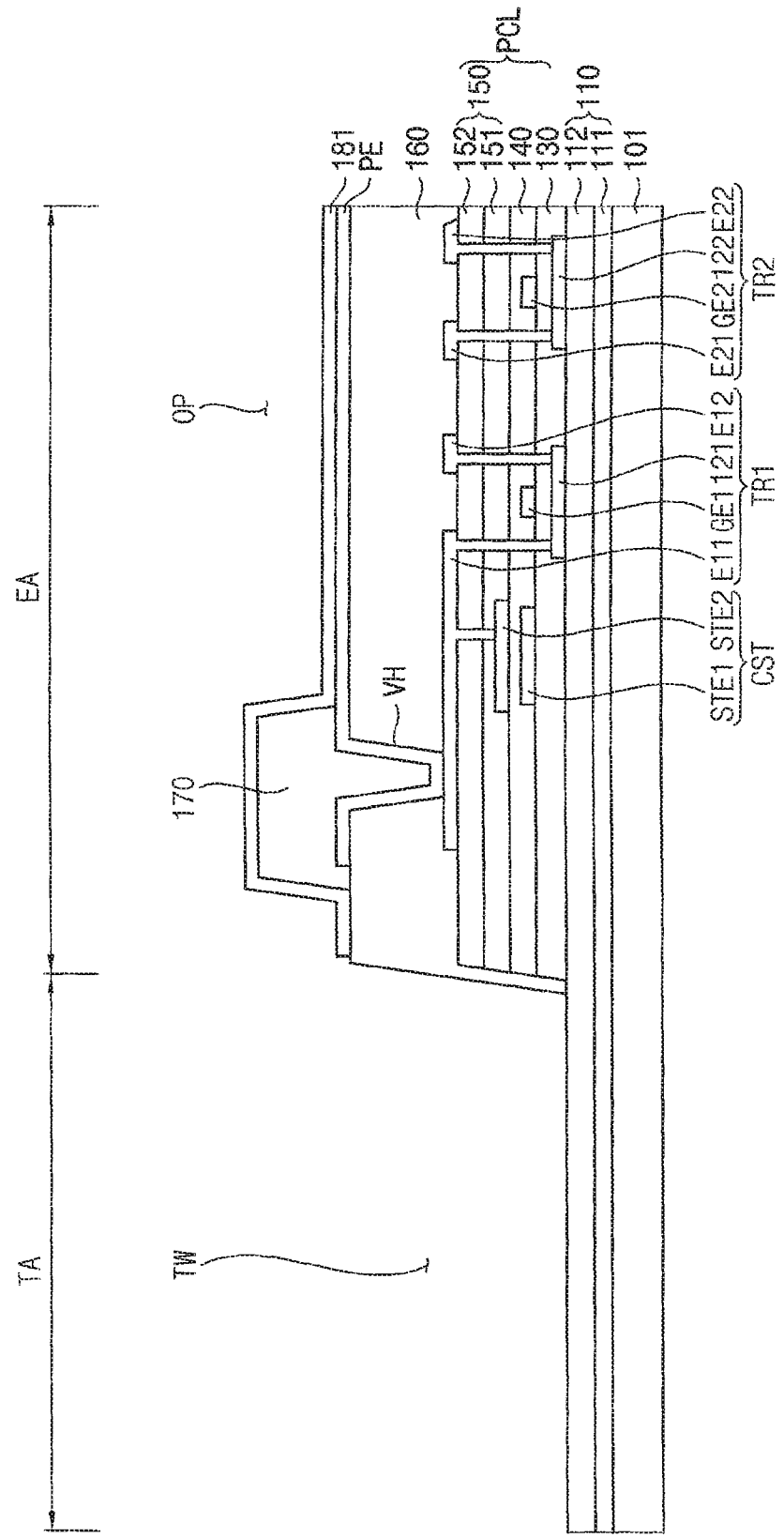
Figure 6:
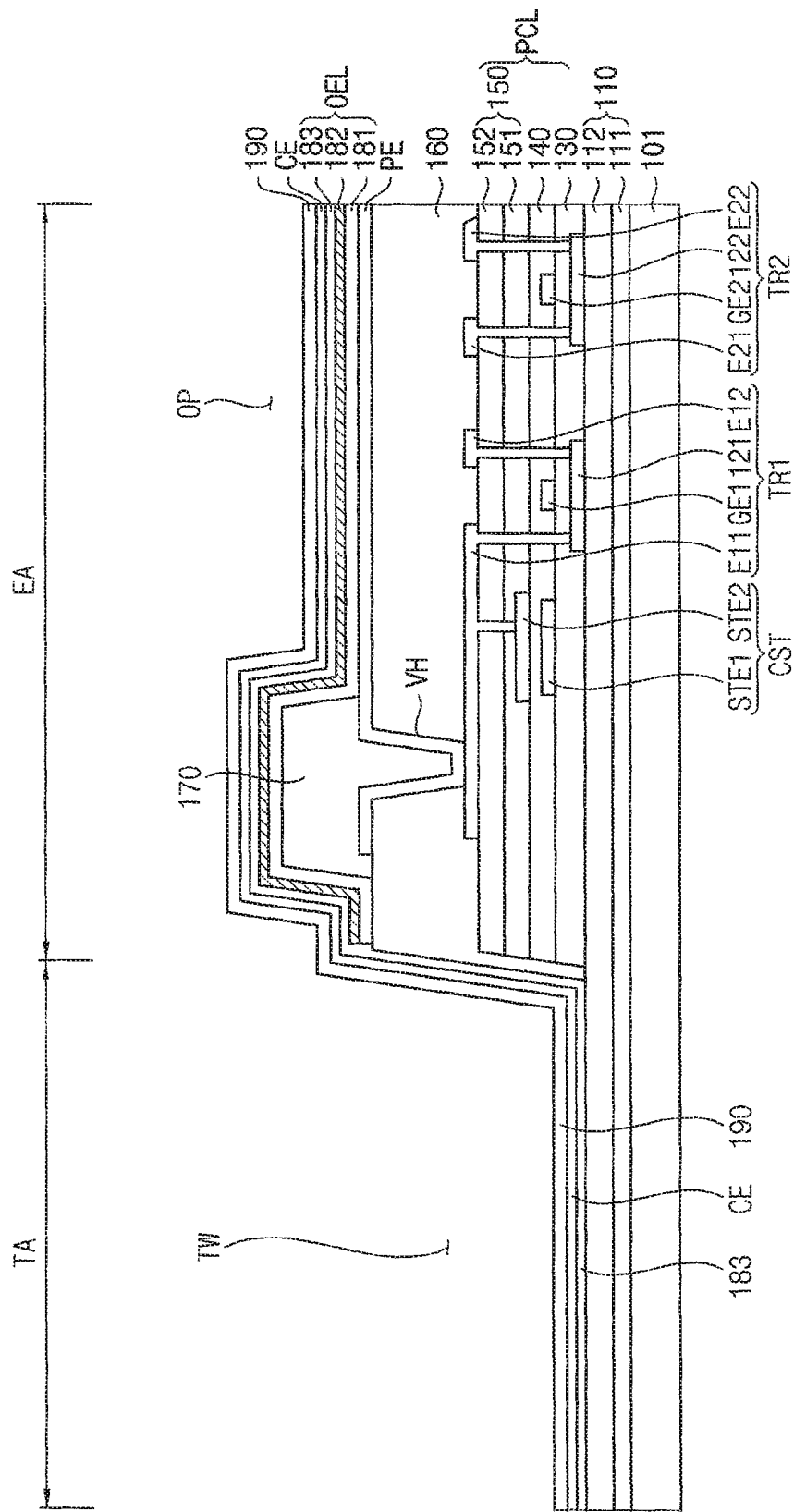

FIGS. 4 to 6 are cross-sectional views illustrating one method of manufacturing a display apparatus according to an exemplary embodiment.

Referring to FIG. 4, base substrate 101 may include a quartz substrate, a synthetic quartz substrate, a calcium fluoride substrate, a fluoride-doping quartz substrate, a sodalime substrate, a non-alkali substrate, etc.

A buffer layer 110 may be formed on the base substrate 101. The buffer layer 110 may prevent diffusion of metal atoms and/or impurities into the base substrate 101. The buffer layer 110 may have a multi-layer structure. For example, the buffer layer 110 may include a first layer 111 formed of silicon nitride ($SiN_x$), and a second layer 112 formed of silicon oxide ($SiO_x$).

An active layer may be formed on the buffer layer 110. The active layer may be formed of an oxide semiconductor, an inorganic semiconductor (e.g., amorphous silicon, polysilicon, etc.), an organic semiconductor, etc. The active layer may be patterned to form a first active pattern 121 of the first transistor TR1 and a second active pattern 122 of the second transistor TR2.

A gate insulating layer 130 may be formed on the base substrate 101 on which the first and second active patterns 121 and 122 are formed. The gate insulating layer 130 may be formed of silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminium oxide ($AlO_x$), aluminium nitride ($AlN_x$), tantalum oxide ($TaO_x$), hafnium oxide ($HfO_x$), zirconium oxide ($ZrO_x$), titanium oxide ($TiO_x$), etc.

A first gate metal layer may be formed on the gate insulating layer 130. The first gate metal layer may be formed of metal, alloy, metal nitride, conductive metal oxide, transparent conductive material, etc. The first gate metal layer may be patterned to form a first gate metal pattern. The first gate metal pattern may include a first storage electrode STE1, a first gate electrode GE1, and a second gate electrode GE2.

A first insulating interlayer 140 may be formed on base substrate 101 on which the first storage electrode STE1, the first gate electrode GE1, and the second gate electrode GE2 are formed. The first insulating interlayer 140 may be formed of silicon oxide, silicon nitride, silicon oxynitride, etc., which may be used alone or in any suitable combination.

A second gate metal layer may be formed on the first insulating interlayer 140. The second gate metal layer may be patterned to form a second gate metal pattern. The second gate metal pattern may include a second storage electrode STE2.

A second insulating interlayer 150 may be formed on the base substrate 101 on which the second storage electrode STE2 is formed. The second insulating interlayer 150 may include a first layer 151 formed of silicon oxide ($SiO_x$) and a second layer 152 formed of silicon nitride ($SiN_x$).

A plurality of contact holes may be formed on the base substrate 101 in the emission area EA, and a transmission window TW that exposes the buffer layer 110 may be formed on the base substrate 101 in the transmission area TA. Alternatively, the transmission window TW may be formed by etching a planarization layer 160 and a pixel definition layer 170 and thus, may expose a second intercalation insulating layer 150.

A source metal layer may be formed on the second insulating interlayer 150. The source metal layer may be patterned to form a source metal pattern. The source metal pattern may include first and second electrodes E11 and E12 of the first transistor TR1 and first and second electrodes E21 and E22 of the second transistor TR2. The source metal pattern, the first gate metal pattern, and the second gate metal pattern may be connected to each other through the plurality of contact holes.

A planarization layer 160 may be formed on the base substrate 101 on which the first and second electrodes E11, E12, E21, and E22 are disposed. The planarization layer 160 may be formed of an organic material or an inorganic material. The planarization layer 160 may be patterned to form a via hole VH that exposes the first electrode E11 of the first transistor TR1 in the emission area EA and the transmission window TW that exposes the buffer layer 110 in the transmission area TA.

A pixel electrode layer PEL may be formed on the base substrate 101 on which the via hole VH and the transmission window TW are formed. The pixel electrode layer PEL may be formed of metal, alloy, metal nitride, conductive metal oxide, transparent conductive material, etc., which may be used alone or in any suitable combination. The pixel electrode layer PEL may be patterned to from a pixel electrode PE in the emission area EA.

A pixel defining layer 170 may be formed on the base substrate 101 on which the pixel electrode PE is disposed. The pixel defining layer 170 is patterned to form the transmission window TW in the transmission area TA and an opening OP that exposes the pixel electrode PE in the emission area EA.

Referring to FIG. 5, a hole layer 181 may be formed on the base substrate 101 on which the transmission window TW and the opening OP are formed.

According to the exemplary embodiment, the hole layer 181 may be selectively formed in the emission area EA using a mask.

As noted above, the hole layer 181 may include a hole injection layer HIL and a hole transport layer HTL. The hole injection layer HIL may be formed on the pixel electrode PE and the hole transport layer HTL may be formed on the hole injection layer HIL.

Referring to FIG. 6, a color emission layer 182 may be formed on the base substrate 101 on which the hole layer 181 is formed.

The color emission layer 182 may be formed on the hole layer 181 in the emission area EA using a mask. The color emission layer 182 may be formed of a different color emission material according to the first to third subpixel areas.

An electron layer 183 may be formed on the base substrate 101 on which the color emission layer 182 is formed. The electron layer 183 may be formed on all of the transmission area TA and the emission area EA.

As noted above, the electron layer 183 may include an electron injection layer EIL and an electron transport layer ETL. The electron transport layer ETL is formed on the color emission layer 182 and the electron injection layer EIL is formed on the electron transport layer ETL.

A common electrode CE may be formed in all of the transmission area TA and the emission area EA on the base substrate 101 on which the electron layer 183 is formed. Thus, the common electrode CE may be formed on the electron injection layer EIL.

The organic light emitting diode OLED may be defined by the pixel electrode PE, the organic emission layer OEL and the common electrode CE which are formed in the emission area EA.

The encapsulation layer 190 may be disposed on all of the emission area EA and the transmission area TA on the base substrate 101 on which the common electrode CE is formed. The encapsulation layer 190 may protect the organic light emitting diode OLED. The encapsulation layer 190 may include a plurality of inorganic layers or a suitable combination thereof.

According to the exemplary embodiment shown in FIG. 6, in the transmission area T, the organic emission layer OEL may include only the electron layer 183 among the hole layer 181, the color emission layer 182 and the electron layer 183.

The hole injection layer HIL may have the greatest thickness and the hole injection layer HIL may have the highest refractive index among the hole injection layer HIL, the hole transport layer HTL, the electron transport layer ETL, and the electron injection layer EIL. Thus, a transmittance may decrease in an interface of the hole injection layer HIL having a high refractive index.

In order to prevent the transmittance from decreasing, according to the exemplary embodiment, the hole injection layer HIL is not formed in the transmission area and thus, the display apparatus may prevent a decrease in transmittance as a result of the hole injection layer having the high refractive index in the transmission area.

Figure 7:
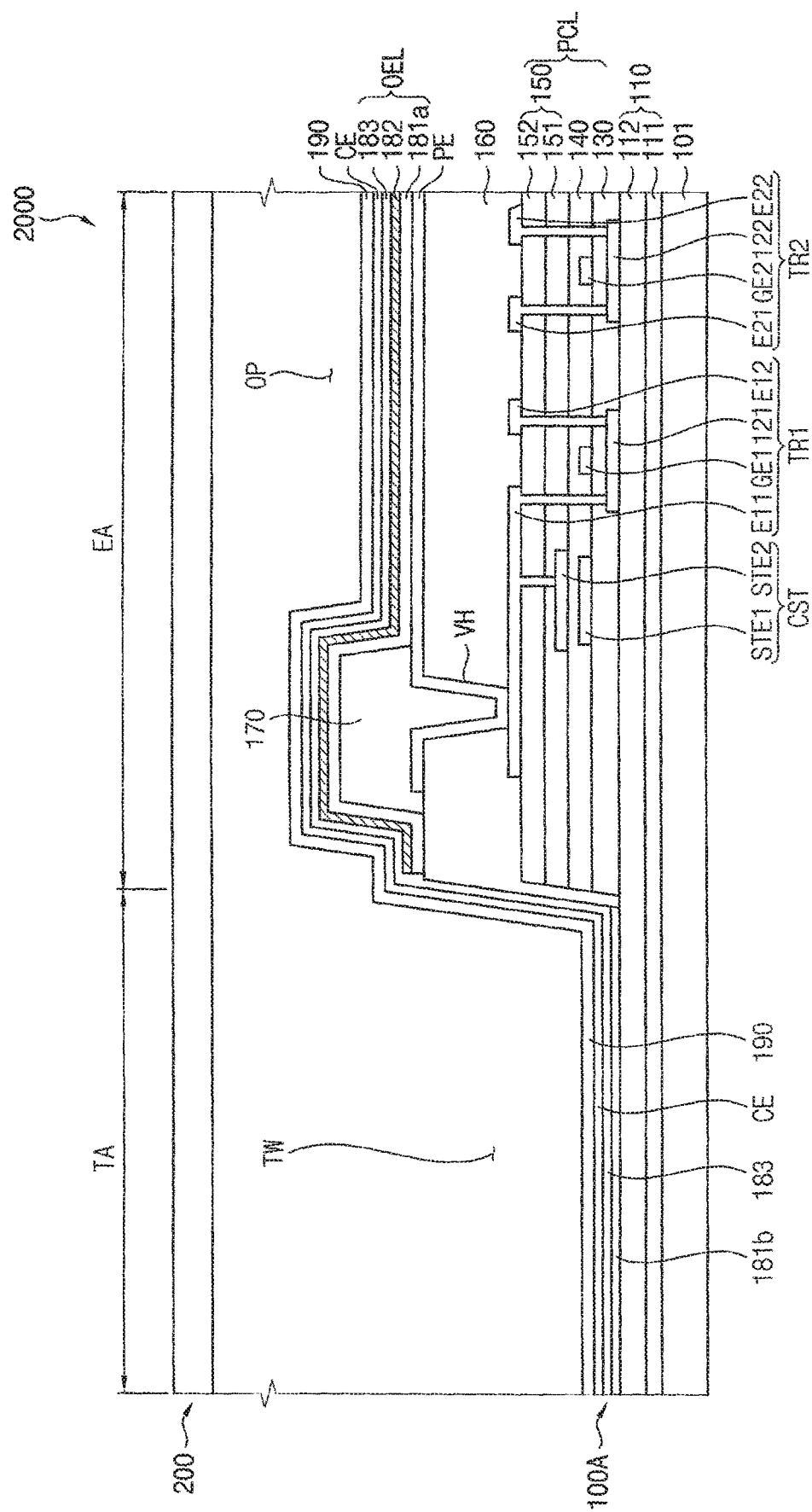
FIG. 7 is a cross-sectional view illustrating a display apparatus according to an exemplary embodiment.

FIG. 7 is a cross-sectional view illustrating a display apparatus according to an exemplary embodiment.

Referring to FIG. 7, the display apparatus 2000 may include a display substrate 100A and an opposing substrate 200 opposite to the display substrate 100A.

The display substrate 100A may include a base substrate 101, a buffer layer 110, a pixel circuit layer PCL, a planarization layer 160, a pixel electrode PE, a pixel definition layer 170, an organic emission layer OEL, a common electrode CE, and encapsulation layer 190.

According to the exemplary embodiment shown in FIG. 7, in comparison with the display substrate 100 according to the previous exemplary embodiment, the hole layer 181b in the transmission area TA may have a thickness different from that of the hole layer 181a in the emission area EA. Hereinafter, the same reference numerals will be used to refer to the same or like parts as those described in the previous exemplary embodiment, and any repetitive detailed explanation may be simplified or omitted.

The first base substrate 101 may be formed of a transparent material.

The buffer layer 110 may be disposed in the emission area EA and the transmission area TA on the base substrate 101. For example, the buffer layer 110 may include a first layer 111 formed of silicon nitride ($SiN_x$) and a second layer 112 formed of silicon oxide ($SiO_x$).

The pixel circuit layer PCL may be disposed in the emission area EA on the base substrate 101. The pixel circuit layer PCL may include a first transistor TR1, a second transistor TR2, and a storage capacitor CST.

The planarization layer 160 may be disposed in the emission area EA on the first base substrate 101 on which the pixel circuit layer PCL is disposed to level the emission area EA. A via hole VH that exposes the first electrode E11 of the first transistor TR1 may be formed in the planarization layer 160.

The pixel electrode PE may be connected to the first transistor TR1 through the via-hole VH and may be disposed on the planarization layer 160 in the emission area EA.

The pixel electrode PE may be formed of metal, alloy, metal nitride, conductive metal oxide, transparent conductive material, etc., which may be used alone or in any suitable combination.

The pixel defining layer 170 may be disposed in the emission area EA on the first base substrate 101 on which the pixel electrode PE is disposed. An opening OP may be formed in the pixel defining layer 170 exposing a portion of the pixel electrode PE.

The organic emission layer OEL may include a hole layer 181, a color emission layer 182, and an electron layer 183.

Each of the hole layers 181a and 181b in the emission area EA and the transmission area TA may include a hole injection layer HIL adjacent to the pixel electrode PE and a hole transport layer HTL adjacent to the color emission layer 182, as in the hole layer 181 of FIG. 3B.

The color emission layer 182 may include light-emitting materials which emit a color light. For example, a first subpixel area may include a red light emitting layer which emits a red light, a second sub area may include a green light emitting layer which emits a green light, and a third sub area may include a blue light emitting layer which emits a blue light.

The electron layer 183 may include an electron injection layer EIL adjacent to the common electrode CE and an electron transport layer ETL adjacent to the color emission layer 182, as in the electron layer 183 of FIG. 3B.

The hole layer 181a, the color emission layer 182, and the electron layer 183 may be substantially stacked in the emission area EA. The first hole layer 181a may include a hole injection layer HIL having a first thickness t1 and a hole transport layer HTL.

The second hole layer 181b and electron layer 183 may substantially stacked in the transmission area TA. The second hole layer 181b may include a hole injection layer HIL having a second thickness different from the first thickness t1 and a hole transport layer HTL.

The second thickness t2 of the hole injection layer HIL may be determined to be a thickness in which the transmission area TA has the highest transmittance. For example, when the hole injection layer HIL in the emission area EA has a first thickness t1 of about 107.5 nm, the hole injection layer HIL in the transmission area TA may be determined to the second thickness t2 of about 20 nm or about 160 nm in which the transmission area TA has the highest transmittance.

Although not shown in figures, in the transmission area TA, the hole transport layer HTL may be omitted to further improve the transmittance. In other words, in the transmission area T, the second hole injection layer HIL of the second thickness t2 and the electron layer 183 may sequentially stacked on the buffer layer 110.

The common electrode CE may be disposed in the emission area EA and the transmission area TA on the base substrate 101 on which the organic emission layer OEL is disposed. Thus, the organic light emitting diode OLED may be defined by the pixel electrode PE, the organic emission layer OEL, and the common electrode CE which are disposed in the emission area EA.

The encapsulation layer 190 may be disposed on the emission area EA and the transmission area TA on the base substrate 101 on which the common electrode CE is disposed.

Figure 8:
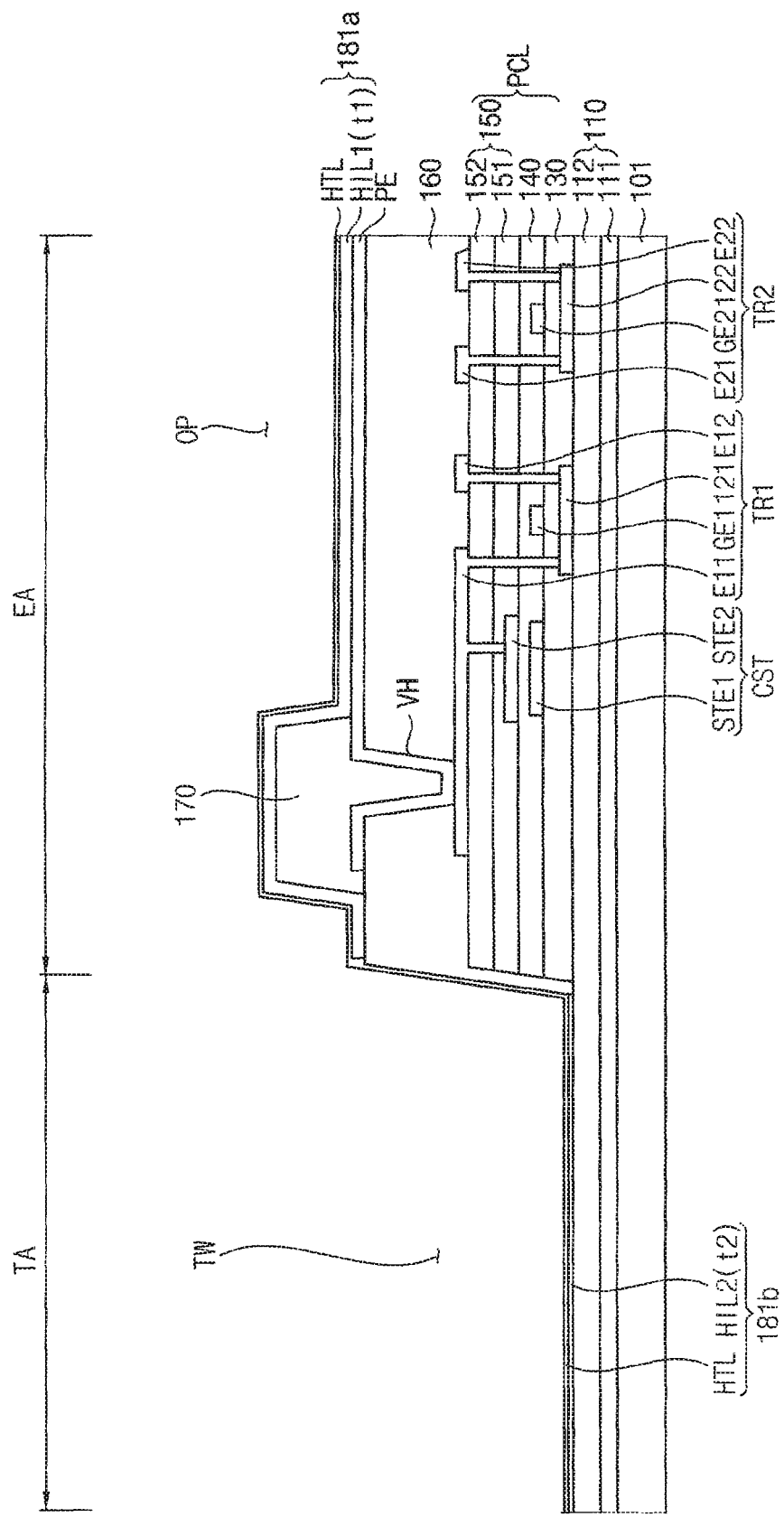
FIG. 8 and FIG. 9 are cross-sectional views illustrating one method of manufacturing a display apparatus according to an exemplary embodiment.
Figure 9:
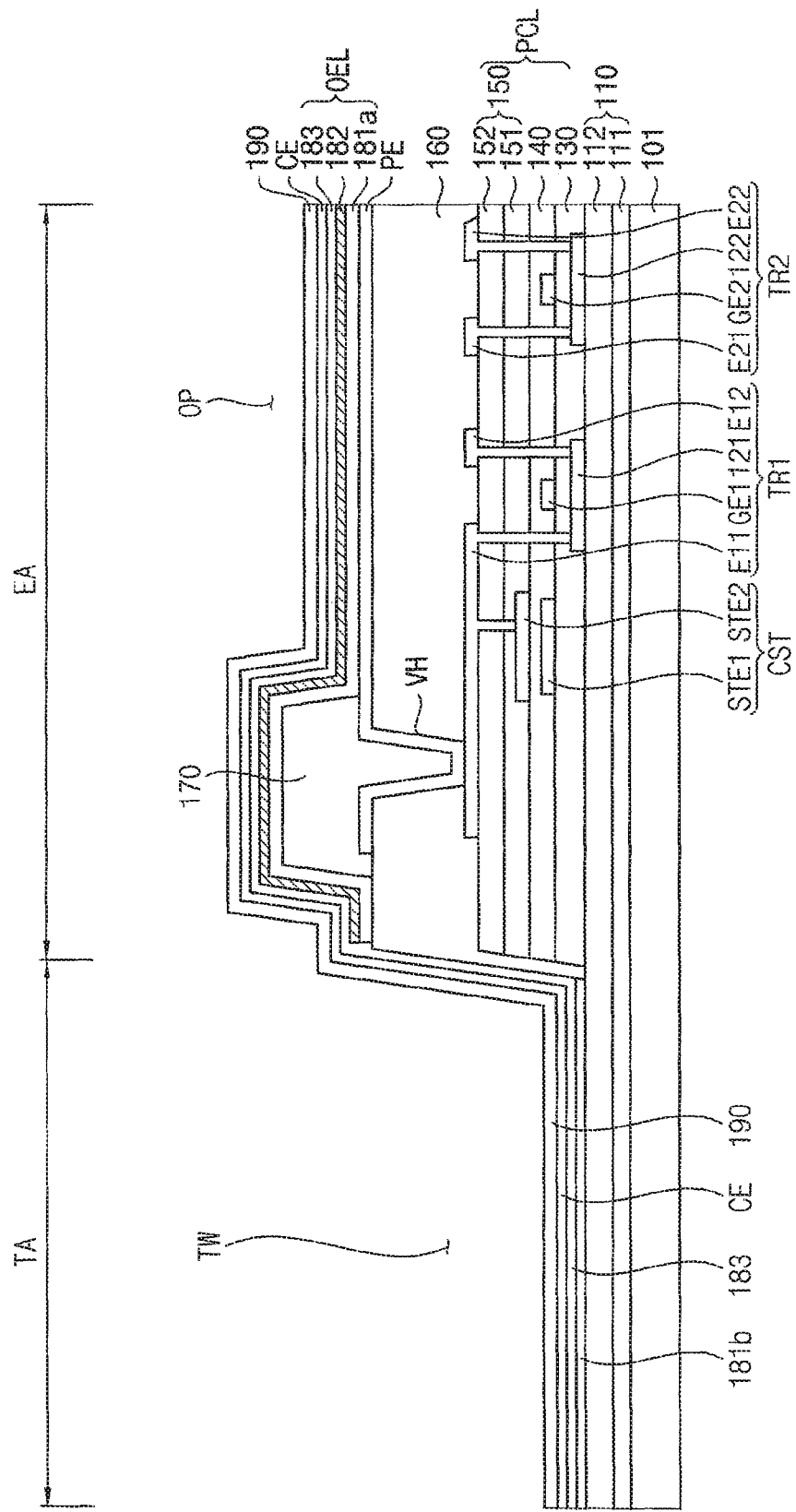

FIGS. 8 and 9 are cross-sectional views illustrating one method of manufacturing a display apparatus according to an exemplary embodiment.

Referring to FIG. 4, the display apparatus may include a buffer layer 110, a pixel circuit layer PCL, a pixel electrode PE, a planarization layer 160 and a pixel definition layer 170 in the emission area EA of the base substrate 101 and a transmission window TW exposing the buffer layer 110 in the transmission area TA of the base substrate 101, which are formed using methods being substantially the same as those of the previous exemplary embodiment.

Referring to FIGS. 4 and 8, the transmission window TW that exposes the buffer layer 110 is formed in the transmission area TA of the base substrate 101 and an opening OP that exposes the pixel electrode PE is formed in the emission area EA of the base substrate 101.

First and second hole injection layers HIL1 and HIL2 may be formed on the base substrate 101 on which the transmission window TW and the opening OP are formed using a mask such that the first hole injection layer HIL1 in the opening OP may have a different thickness from the second hole injection layer HIL2 in the transmission window TW.

According to the exemplary embodiment, the first hole injection layer HIL1 having a first thickness t1 may be formed in the emission area EA and the second hole injection layer HIL2 having a second thickness t2 different from the first thickness t1 may be formed in the transmission area TA. The second thickness t2 of the second hole injection layer HIL2 may be determined to have the highest transmittance in the transmission area TA. The second thickness t2 may be smaller or larger than the first thickness t1.

A hole transport layer HTL may be formed on the base substrate 101 on which the first hole injection layers HIL1 of the first thickness t1 and the second and HIL2 of the second thickness t2 are formed.

The hole transport layer HTL may be formed in all of the emission area EA and the transmission area TA. Alternatively, the hole transport layer HTL may be selectively formed in only the emission area EA on which the first hole injection layer HIL1 is formed using a mask.

Therefore, a first hole layer 181a including the first hole injection layer HIL1 and the hole transport layer HTL may be formed in the emission area EA.

A second hole layer 181b including the second hole injection layer HIL2 and the hole transport layer HTL may be formed in the transmission area TA. In addition, the hole transport layer HTL may be omitted and only the second hole injection layer HIL2 may be formed in the transmission area TA.

Referring to FIG. 9, a color emission layer 182 may be formed on the base substrate 101 on which the first and second hole layers 181a and 181b are formed.

The color emission layer 182 may be formed on the first hole layer 181a in the emission area EA using a mask. The color emission layer 182 may have a different color emission layer according to the first to third subpixel areas.

An electron layer 183 may be formed on the base substrate 101 on which the color emission layer 182 is formed. The electron layer 183 may be formed on all of the transmission area TA and the emission area EA.

The electron layer 183 may include an electron injection layer EIL and an electron transport layer ETL, as in the embodiment of FIG. 3B. The electron transport layer ETL is formed on the color emission layer 182 and the electron injection layer EIL is formed on the electron transport layer ETL.

A common electrode CE may be formed in all the transmission area TA and the emission area EA on the base substrate 101 on which the electron layer 183 is formed. Thus, the common electrode CE may be formed on the electron injection layer EIL.

The organic light emitting diode OLED may be defined by the pixel electrode PE, the organic emission layer OEL and the common electrode CE which are formed in the emission area EA.

The encapsulation layer 190 may be disposed on all the emission area EA and the transmission area TA on the base substrate 101 on which the common electrode CE is formed.

According to the exemplary embodiment, the hole injection layer may have a thickness corresponding to the highest transmittance in the transmission area and thus, the transmittance of the transmission area may be improved.

Figure 10:
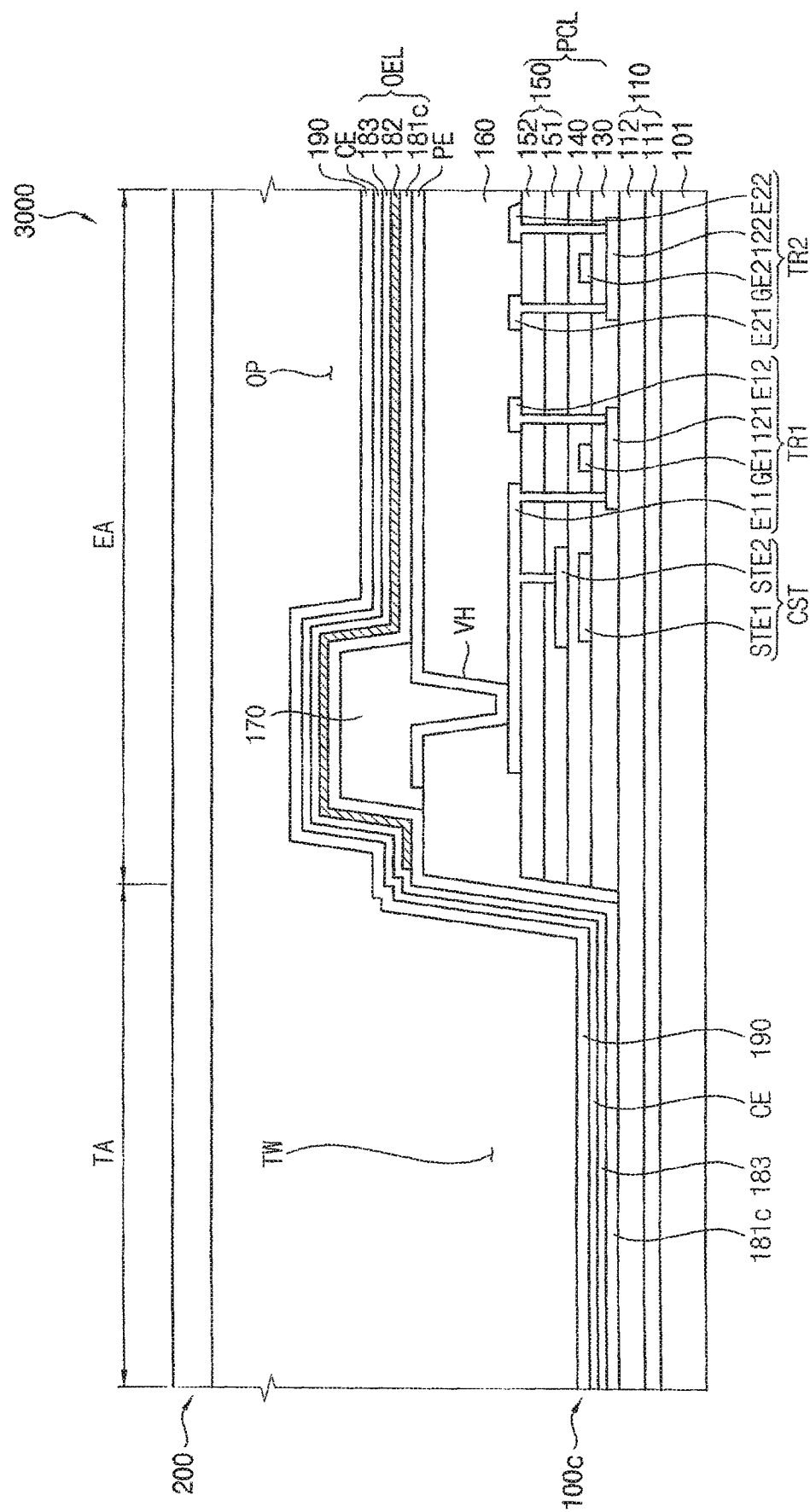
FIG. 10 is a cross-sectional view illustrating a display apparatus according to an exemplary embodiment.

FIG. 10 is a cross-sectional view illustrating a display apparatus according to an exemplary embodiment.

Referring to FIG. 10, the display apparatus 3000 may include a display substrate 100C and an opposing substrate 200 opposite to the display substrate 100C.

The display substrate 100C may include a base substrate 101, a buffer layer 110, a pixel circuit layer PCL, a planarization layer 160, a pixel electrode PE, a pixel definition layer 170, an organic emission layer OEL, a common electrode CE, and an encapsulation layer 190.

According to the exemplary embodiment, the display substrate 100C in comparison with the display substrate 100 according to the previous exemplary embodiment, may include an organic emission layer OEL which includes a plurality of organic layers having different refractive indexes from each other. Hereinafter, the same reference numerals will be used to refer to the same or like parts as those described in the previous exemplary embodiment, and any repetitive detailed explanation may be simplified or omitted.

The first base substrate 101 may be formed of a transparent material.

The buffer layer 110 may be disposed in the emission area EA and the transmission area TA on the base substrate 101. For example, the buffer layer 110 may include a first layer 111 formed of silicon nitride ($SiN_x$) and a second layer 112 formed of silicon oxide ($SiO_x$).

The pixel circuit layer PCL may be disposed in the emission area EA on the base substrate 101. The pixel circuit layer PCL may include a first transistor TR1, a second transistor TR2, and a storage capacitor CST.

The planarization layer 160 may be disposed in the emission area EA on the first base substrate 101 on which the pixel circuit layer PCL is disposed to level the emission area EA. A via hole VH that exposes the first electrode E11 of the first transistor TR1 may be formed in the planarization layer 160.

The pixel electrode PE may be connected to the first transistor TR1 through the via-hole H and may be disposed on the planarization layer 160 in the emission area EA.

The pixel electrode PE may be formed of metal, alloy, metal nitride, conductive metal oxide, transparent conductive material, etc., which may be used alone or in any suitable combination.

The pixel defining layer 170 may be disposed in the emission area EA on the first base substrate 101 on which the pixel electrode PE is disposed. An opening OP may be formed in the pixel defining layer 170 exposing a portion of the pixel electrode PE.

The organic emission layer OEL may include a hole layer 181c, a color emission layer 182, and an electron layer 183.

The hole layer 181c may include a hole injection layer HIL adjacent to the pixel electrode PE and a hole transport layer HTL adjacent to the color emission layer 182, similar to the embodiment of FIG. 3A.

The color emission layer 182 may be formed on the hole layer 181 in the emission area EA using a mask. The color emission layer 182 may be formed of a different color emission material according to the first to third subpixel areas.

The electron layer 183 may include an electron injection layer EIL adjacent to the common electrode CE and an electron transport layer ETL adjacent to the color emission layer 182, similar to the embodiment of FIG. 3A.

The hole injection layer HIL may have the greatest thickness among the hole injection layer HIL, the hole transport layer HTL, the electron transport layer ETL and the electron injection layer EIL.

The hole layer 181c, the color emission layer 182 and the electron layer 183 may substantially stacked in the emission area EA. For example, the hole layer 181c, the color emission layer 182, and the electron layer 183 may substantially stacked on the pixel electrode PE exposed by the opening OP.

The second hole layer 181c and electron layer 183 may be substantially stacked in the transmission area TA.

According to the exemplary embodiment, the hole injection layer HIL may have a refractive index between refractive indexes of upper and lower layers adjacent to the hole injection layer HIL according to a stacked structure in the transmission area TA. Therefore, stacked organic layers may have sequentially changed refractive indexes corresponding to the stacked structure in the transmission area TA, and a reversal of the refractive indexes in the stacked organic layers which may cause an undesirable resonance may be avoided. Thus, the transmittance in the transmission area TA may be improved.

The common electrode CE may be disposed in all the emission area EA and the transmission area TA on the base substrate 101 on which the organic emission layer OEL is disposed. Thus, the organic light emitting diode OLED may be defined by the pixel electrode PE, the organic emission layer OEL and the common electrode CE which are disposed in the emission area EA The encapsulation layer 190 may be disposed on all the emission area EA and the transmission area TA on the base substrate 101 on which the common electrode CE is disposed.

Figure 11:
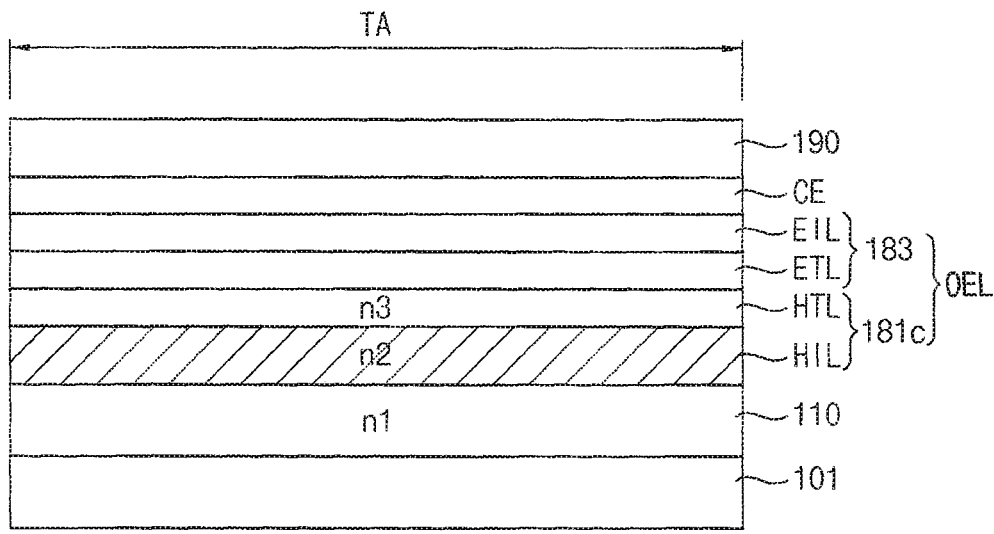
FIG. 11 and FIG. 12 are cross-sectional views illustrating a transmission area of a display apparatus according to an exemplary embodiment.
Figure 12:
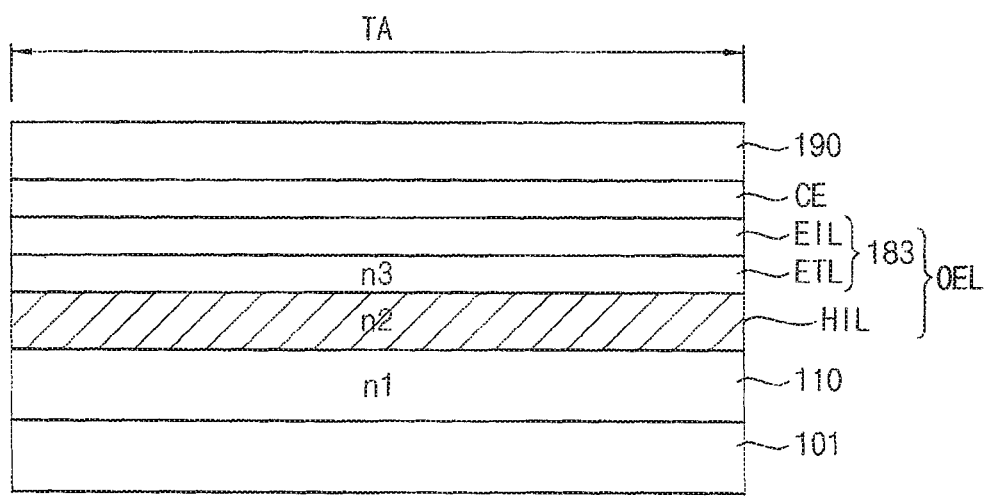

FIGS. 11 and 12 are cross-sectional views illustrating a transmission area of a display apparatus according to an exemplary embodiment.

Referring to FIG. 11, a buffer layer 110, a hole injection layer HIL, a hole transport layer HTL, an electron transport layer ETL, an electron injection layer EIL, a common electrode CE and an encapsulation layer 190 may be sequentially stacked in the transmission area TA of the base substrate 101.

The buffer layer 110 may be a lower layer adjacent to the hole injection layer HIL and have a first refractive index n1. The hole transport layer HTL may be an upper layer adjacent to the hole injection layer HIL and have a third refractive index n3. The hole injection layer HIL may have a second refractive index n2 that is greater than the first refractive index n1 and less than the third refractive index n3.

For example, when the buffer layer 110 may be formed of silicon oxide ($SiO_x$) having the first refractive index n1 of about 1.4 and the hole transport layer HTL may have the third refractive index n3 of about 1.8, the hole injection layer HIL may have the second refractive index n2 that is greater than about 1.4 and less than about 1.9 (about 1.4<n2<about 1.9).

Although not shown in figures, referring to FIG. 10, when the transmission window TW may expose at least one of a plurality of insulating layers 130, 140 and 150 of the pixel circuit layer PCL in the transmission window TW, the hole injection layer HIL, the hole transport layer HTL, the electron transport layer ETL, the electron injection layer EIL, the common electrode CE and the encapsulation layer 190 are sequentially stacked on an insulating layer exposed by the transmission window TW. The hole injection layer HIL may have a refractive index between a first refractive index n1 of the insulating layer being the lower layer and the third refractive index n3 of the hole transport layer HTL being the upper layer.

Referring to FIG. 12, a buffer layer 110, a buffer layer 110, a hole injection layer HIL, an electron transport layer ETL, an electron injection layer EIL, a common electrode CE, and an encapsulation layer 190 may be sequentially stacked in the transmission area TA of the base substrate 101.

The buffer layer 110 may be a lower layer adjacent to the hole injection layer HIL and have a first refractive index n1. The electron transport layer ETL may be an upper layer adjacent to the hole injection layer HIL and have a third refractive index n3. The hole injection layer HIL may have a second refractive index n2 that is greater than the first refractive index n1 and less than the third refractive index n3.

For example, when the buffer layer 110 may be formed of silicon oxide ($SiO_x$) having the first refractive index n1 of about 1.4 and the hole injection layer HIL may have the third refractive index n3 of about 1.8, the electron transport layer ETL may have the second refractive index n2 that is greater than about 1.4 and less than about 1.9 (about 1.4<n2<about 1.9).

Although not shown in figures, referring to FIG. 10, when the transmission window TW may expose at least one of a plurality of insulating layers 130, 140, and 150 of the pixel circuit layer PCL in the transmission window TW, the hole injection layer HIL, the hole transport layer HTL, the electron transport layer ETL, the electron injection layer EIL, the common electrode CE and the encapsulation layer 190 are sequentially stacked on an insulating layer exposed by the transmission window TW. The hole injection layer HIL may have a refractive index between a first refractive index n1 of the insulating layer being the lower layer and the third refractive index n3 of the hole transport layer HTL being the upper layer.

For example, when the transmission window TW exposes a second insulating interlayer 150 in the transmission area TA, the hole injection layer HIL, the hole transport layer HTL, the electron injection layer EIL, the common electrode CE and the encapsulation layer 190 are sequentially stacked on the second insulating interlayer 150 of the transmission area TA. The hole injection layer HIL may have a refractive index between a first refractive index n1 of the second insulating interlayer 150 being the lower layer and the third refractive index n3 of the hole transport layer HTL being the upper layer.

Therefore, the hole injection layer HIL has a refractive index between refractive indexes of the upper and lower layers adjacent to the hole injection layer HIL. Thus, a reversal of the refractive index in the stacked organic layers which causes resonance may be avoided. Thus, the transmittance in the transmission area TA may be improved.

According to the exemplary embodiments, the hole injection layer may be disposed only in the emission area EA. In addition, the hole injection layer, the upper layer adjacent to the hole injection layer, and the lower layer adjacent to the hole injection layer may have sequential refractive indexes without reversal of the refractive index with respect to the stacked structure in the transmission area TA. In addition, the hole injection layer may have a thickness corresponding to the highest transmittance in the transmission area. Therefore, the transmittance of the transmission area may be improved.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display substrate comprising:
   a base substrate comprising a plurality of pixel areas, each of the plurality of pixel areas comprising an emission area and a transmission area;
   a pixel circuit layer disposed in the emission area and comprising at least one transistor;
   a pixel electrode disposed on the pixel circuit layer and connected to the pixel circuit layer;
   a hole injection layer disposed on a pixel electrode in the emission area and the base substrate in the transmission area, the hole injection layer having a refractive index between refractive indexes of upper and lower layers of the hole injection layer in the transmission area;
   an emission layer disposed on the hole injection layer in the emission area;
   an electron injection layer disposed on the base substrate on which the emission layer is disposed; and
   a common electrode disposed on the base substrate on which the electron injection layer is disposed.

2. The display substrate of claim 1, wherein the refractive indexes of the lower layer, the hole injection layer, and the upper layer gradually increase in the transmission area.

3. The display substrate of claim 1, further comprising:
   a buffer layer disposed between the base substrate and the pixel circuit layer in the emission area;
   a hole transport layer disposed between the hole injection layer and the emission layer in the emission area; and
   an electron transport layer disposed between the electron injection layer and the emission layer in the emission area.

4. The display substrate of claim 3, wherein the lower layer is the buffer layer and the upper layer is the electron transport layer in the transmission area.

5. The display substrate of claim 3, wherein the lower layer is the buffer layer and the upper layer is the hole transport layer in the transmission area.

6. The display substrate of claim 3, wherein the pixel circuit layer comprises a plurality of metal patterns and a plurality of insulation layers between the plurality of metal patterns, and the lower layer is at least one of the plurality of insulation layers in the transmission area.

7. The display substrate of claim 3, further comprising an encapsulation layer disposed on the common electrode in the emission area and the transmission area.

* * * * *